(12) United States Patent
Chung

(10) Patent No.: US 7,304,502 B2
(45) Date of Patent: Dec. 4, 2007

(54) LEVEL SHIFTER AND FLAT PANEL DISPLAY COMPRISING THE SAME

(75) Inventor: Bo Young Chung, Seoul (KR)

(73) Assignee: Samsung SDI Co., Ltd, Suwon-si (KR)

( * ) Notice: Subject to any disclaimer, the term of this patent is extended or adjusted under 35 U.S.C. 154(b) by 183 days.

(21) Appl. No.: 11/170,782

(22) Filed: Jun. 28, 2005

(65) Prior Publication Data

US 2006/0006908 A1    Jan. 12, 2006

(30) Foreign Application Priority Data

Jun. 28, 2004  (KR) .............. 10-2004-0049123
Jul. 28, 2004  (KR) .............. 10-2004-0059023

(51) Int. Cl.
*H03K 19/0175* (2006.01)
*H03K 19/094* (2006.01)
*H03K 3/00* (2006.01)
*H03L 5/00* (2006.01)

(52) U.S. Cl. .................. 326/68; 326/62; 326/63; 326/80; 326/81; 326/83; 327/108; 327/109; 327/333

(58) Field of Classification Search ............ 326/62, 326/63, 68, 80, 81, 83; 327/108, 109, 333
See application file for complete search history.

(56) References Cited

U.S. PATENT DOCUMENTS

| 4,449,066 A | * | 5/1984 | Aoyama et al. ............ 326/88 |
| 6,259,299 B1 | * | 7/2001 | Ryu ........................ 327/333 |
| 6,891,422 B2 | * | 5/2005 | Shin ........................ 327/333 |
| 7,005,909 B2 | * | 2/2006 | Shin ........................ 327/333 |
| 7,180,356 B2 | * | 2/2007 | Kanbara et al. ........ 327/333 |
| 2004/0021496 A1 | | 2/2004 | Shin |
| 2005/0179480 A1 | * | 8/2005 | Shin ........................ 327/333 |

* cited by examiner

*Primary Examiner*—Rexford Barnie
*Assistant Examiner*—Dylan White
(74) *Attorney, Agent, or Firm*—Christie, Parker & Hale, LLP

(57) ABSTRACT

A level shifter and a flat panel display comprising the same, with reduced power consumption. The level shifter includes: a first transistor to apply a first voltage to an output terminal in correspondence with a first input signal; a second transistor to apply a second voltage to an output terminal in correspondence with voltage applied between gate and source electrodes thereof; a third transistor to lower the voltage applied between the gate and source electrodes of the second transistor according to the first input signal; and a capacitor to keep the voltage applied between the gate and source electrodes of the second transistor to turn on the second transistor in correspondence with the second input signal.

30 Claims, 10 Drawing Sheets

LEVEL SHIFTER AND FLAT PANEL DISPLAY COMPRISING THE SAME

CROSS-REFERENCE TO RELATED APPLICATIONS

This application claims the benefit of Korean Patent Application No. 2004-59023, filed on Jul. 28, 2004, and Korean Patent Application No. 200449123, filed on Jun. 28, 2004, in the Korean Intellectual Property Office, the disclosures of which are incorporated herein by reference.

FIELD OF THE INVENTION

The present invention relates to a level shifter and a flat panel display comprising the same, and more particularly, to a level shifter and a flat panel display comprising the same with reduced power consumption.

BACKGROUND OF THE INVENTION

A semiconductor integrated circuit may be in need of a voltage level shifter for an interface between circuits requiring different voltage levels. For example, an integrated chip including a semiconductor or the like is generally operated within a predetermined voltage level range, but may need a signal voltage beyond the predetermined voltage level range in order to interface with external systems or to transmit a signal to other systems. In this case, a level shifter is placed between the two systems so as to connect the two systems requiring different signal voltage levels. Such a level shifter is particularly used for shifting the level of the signal voltage from a low voltage level range into a high voltage level range.

A conventional level shifter comprises first and second transistors of a P-metal oxide semiconductor (PMOS) type. The first transistor is connected between a first power line and an output terminal, and the second transistor is diode-connected between the output terminal and a second power line.

In the conventional level shifter, when a low level input voltage is inputted to a gate electrode of the first transistor, a high level output voltage is produced depending on an on-resistance ratio between the first and second transistors.

Further, when a high level input voltage is inputted to the gate electrode of the first transistor, a low level output voltage is increased to be higher than the low level by a threshold voltage (Vth) of the second transistor, that is, increased into (LVSS+|Vth|). Where, LVSS is a low level voltage supplied from the second power line.

However, the conventional level shifter consumes relatively more power because of leakage current due to static current of the second PMOS transistor.

Further, the conventional level shifter is not capable of adjusting the level of the output voltage, because the low level output voltage can only be increased to be higher than the low level input voltage by only the threshold voltage (Vth) of the second transistor.

SUMMARY OF THE INVENTION

In one embodiment, the present invention provides a level shifter and a flat panel display comprising the same, which reduces power consumption.

In one embodiment, the present invention is a level shifter and a flat panel display comprising the same, which outputs two different levels of voltage using two different input signals. In one embodiment, the level shifter comprises a first transistor electrically coupled between an output terminal and a first voltage source supplying a first voltage for applying the first voltage to the output terminal in correspondence with a first input signal applied to a gate electrode of the first transistor; a second transistor electrically coupled between the output terminal and a second voltage source supplying a second voltage for applying the second voltage to the output terminal in correspondence with a voltage applied between gate and source electrodes thereof; a third transistor electrically coupled between the gate and source electrodes of the second transistor for lowering the voltage applied between the gate and source electrodes of the second transistor to zero in correspondence with the first input signal applied to a gate electrode of the third transistor; a fourth transistor electrically coupled between the gate electrode of the second transistor and the second voltage supply for turning on the second transistor in correspondence with a second input signal applied to a gate electrode of the fourth transistor; and a capacitor electrically coupled between the gate and source electrodes of the second transistor to keep the voltage applied between the gate and source electrodes of the second transistor to turn on the second transistor when the fourth transistor is turned off in correspondence with the second input signal.

In one embodiment, the present invention is a level shifter comprises: a first transistor connected between a first power line and an output terminal and controlled by a first input signal applied to its gate electrode; a second transistor connected between a second power line and the output terminal and controlled by a signal applied to a first node connected to its gate electrode; a capacitor having a first electrode connected to the output terminal and a second electrode connected to the first node; a third transistor connected between the output terminal and the first node and controlled by the first input signal applied to its gate electrode; and a fourth transistor connected between the first node and the second power line, and controlled by a second input signal applied to its gate electrode.

In one embodiment, the present invention is a level shifter comprising: a first voltage path supplying a first voltage to an output terminal in correspondence with a first input signal; a second voltage path supplying a second voltage to the output terminal in correspondence with a second input signal; a switch to cut off the second path in correspondence with the first input signal; and a capacitor to re-establish the second path for supplying a second voltage to the output terminal in correspondence with the second input signal.

In one embodiment, the present invention is a level shifter comprises: a first shifter comprising a first transistor to apply a first voltage to a first output terminal in correspondence with a first input signal, a second transistor to apply a second voltage to the first output terminal in correspondence with voltage applied between gate and source electrodes thereof, a third transistor to lower the voltage applied between the gate and source electrodes of the second transistor to zero in correspondence with the first input signal, and a first capacitor to maintain the voltage applied between the gate and source electrodes of the second transistor to turn on the second transistor in correspondence with a second input signal; and a second shifter to output a voltage, which is a complement of the voltage outputted from the first output terminal, to a second output terminal in correspondence with the first and second input signals.

In one embodiment, the present invention is a level shifter comprising: a first transistor controlled by a first input signal and connected between a first power line and a first output terminal; a second transistor connected between the first output terminal and a second power line different from the first power line; a third transistor controlled by the first input signal and connected between the first output terminal and a gate electrode of the second transistor; a fourth transistor controlled by a second input signal, and connected between the gate electrode of the second transistor and the second power line; a first capacitor connected between the first output terminal and the gate electrode of the second transistor; a fifth transistor controlled by the second input signal and connected between the first power line and a second output terminal; a sixth transistor connected between the second output terminal and the second power line; a seventh transistor controlled by the second input signal and connected between the second output terminal and a gate electrode of the sixth transistor; an eighth transistor controlled by the first input signal and connected between the gate electrode of the six transistor and the second power line; and a second capacitor connected between the second output terminal and the gate electrode of the sixth transistor.

In one embodiment, the present invention is a flat panel display comprising: an image displaying module comprising a pixel formed where a data line and a scan line are crossed; a data driver to supply a data signal to the data line; a shift register module to shift an input start pulse in sequence; and a level shifter module comprising a plurality of first level shifters to shift a level of an output signal from the shift register module and output the shifted output signal to the scan line, wherein the first level shifter comprises: a first transistor connected between a first power line and an output terminal and controlled by the output signal; a second transistor connected between a second power line and an output terminal and controlled by a signal applied to a first node; a capacitor having a first electrode connected to the output terminal and a second electrode connected to the first node; a third transistor connected between the output terminal and the first node and controlled by the output signal; and a fourth transistor connected between the first node and the second power line and controlled by a complement of the output signal.

In one embodiment, the present invention is a flat panel display comprising: an image displaying module comprising a plurality of pixels placed adjacent to where a data line and a scan line are crossed; a data driver to supply a data signal to the data line; a shift register module to shift an input start pulse in sequence; and a level shifter module comprising a plurality of first level shifters to shift a level of an output signal from the shift register module and output the shifted output signal to the scan line, wherein the first level shifter comprises: a first shifter comprising a first transistor to apply a first voltage to a first output terminal in correspondence with the output input signal, a second transistor to apply a second voltage to the first output terminal in correspondence with voltage applied between gate and source electrodes thereof, a third transistor to lower the voltage applied between the gate and source electrodes of the second transistor to zero in correspondence with the output signal, and a first capacitor to maintain the voltage applied between the gate and source electrodes of the second transistor to turn on the second transistor in correspondence with the complement of the output signal; and a second shifter to output a voltage, which is reversed to the voltage outputted from the first output terminal, to a second output terminal in correspondence with the output signal and the complement of the output signal.

DETAILED DESCRIPTION

Figure 1:
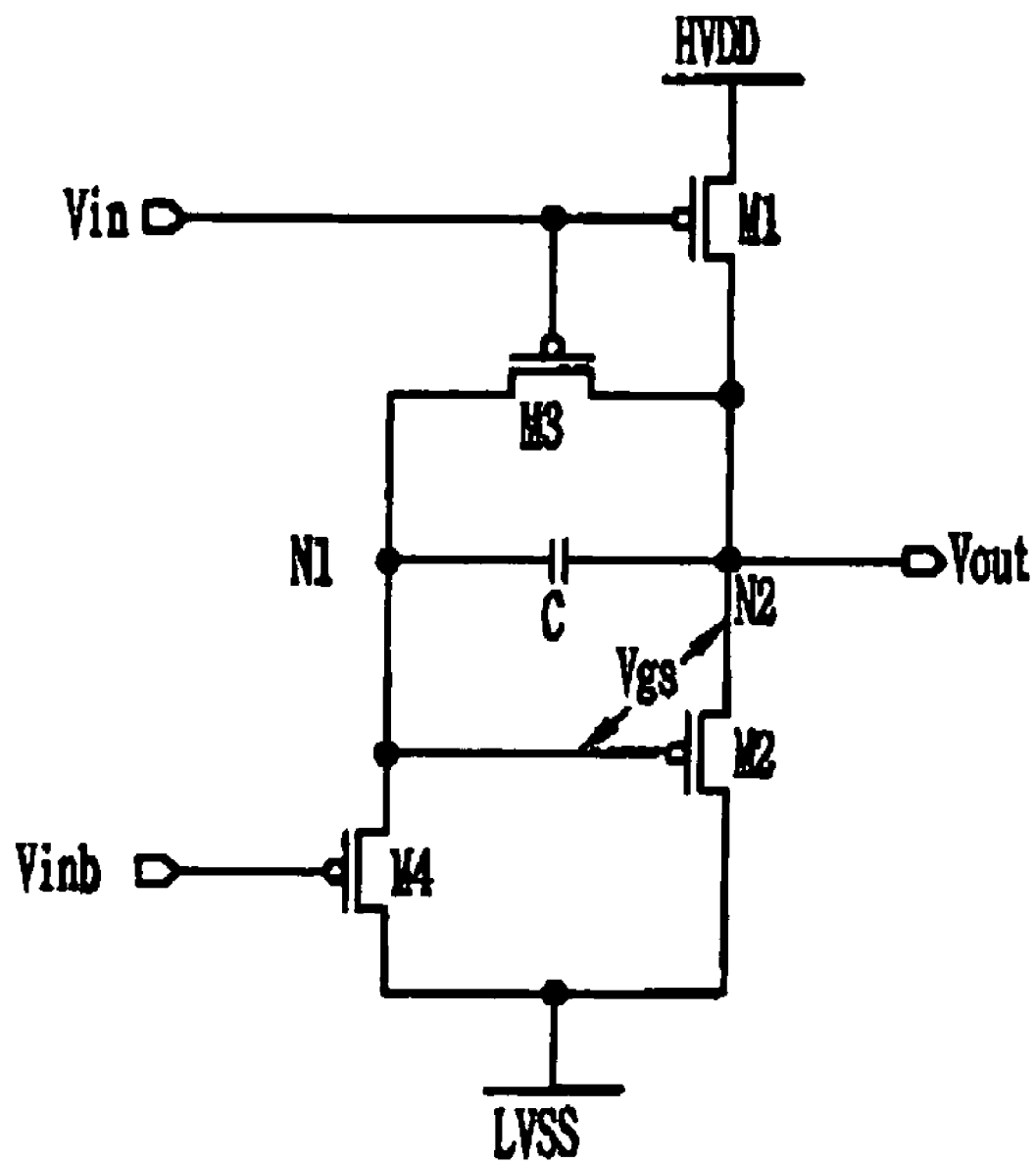
FIG. 1 is a circuit diagram of a level shifter comprising a PMOS transistor, according to a first embodiment of the present invention.

FIG. 1 is a circuit diagram of a level shifter comprising a PMOS transistor, according to a first embodiment of the present invention.

Referring to FIG. 1, the level shifter according to the first embodiment of the present invention comprises first through fourth transistors M1 through M4, and a capacitor C. Here, the first through fourth transistors M1 through M4 are PMOS transistors.

The first transistor M1 is controlled by a first input signal Vin, and electrically connected between a first power line HVDD supplying a first voltage and an output terminal Vout. Here, the first input signal Vin is a pulse signal alternating between a first level voltage and a second level voltage lower than the first level voltage. The first transistor M1 comprises a source electrode connected to the first power line HVDD, a drain electrode connected to the output terminal Vout, and a gate electrode for receiving the first input voltage Vin. The first transistor M1 forms a first path allowing a first voltage to be supplied from the first power line HVDD to the output terminal Vout, based on the first input voltage Vin.

The second transistor M2 is controlled by voltage applied between a gate electrode and a source electrode thereof, and is electrically connected between a second power line LVSS supplying a second voltage different from the first voltage and the output terminal Vout. Here, the second transistor M2 has its source electrode connected to the output terminal Vout, and its drain electrode connected to the second power line LVSS. The second transistor M2 forms a second path allowing a second voltage to be supplied from the second power line LVSS to a second node N2, i.e., the output terminal Vout, based on voltage applied to the first node N1, i.e., to its gate electrode.

The third transistor M3 is controlled by the first input signal Vin, and electrically connected between the output terminal Vout (N2) and the first node N1. The third transistor M3 comprises a source electrode connected to the output terminal Vout, and a drain electrode connected to the first node N1. The third transistor M3 supplies the first voltage based on the first input voltage Vin from the first transistor M1 to the first node N1. Thus, the third transistor M3 is turned on by the first input voltage Vin of a low level, and allows the voltage Vgs between the gate and source electrodes of the second transistor M2 to approach zero (0), thereby, cutting off the second path from the second power line LVSS to the output terminal.

The fourth transistor M4 is controlled by a second input signal Vinb, and is electrically connected between the first node N1 and the second power line LVSS. Here, the second input signal Vinb is a complement (invert) of the first input signal Vin. The fourth transistor M4 comprises a source electrode connected to the first node N1, and a drain electrode connected to the second power line LVSS. The fourth transistor M4 supplies the second voltage (second power line LVSS) based on the second input voltage Vinb to the first node N1.

A capacitor C comprises the first electrode electrically connected to the first node N1, and a second electrode connected to the output terminal Vout. The capacitor C stores the voltage Vgs between the gate and source electrodes of the second transistor M2 depending on a switching operation of the fourth transistor M4, and then turns on/off the second transistor M2, depending on the voltage Vgs. That is, the capacitor C keeps the second transistor M2 being turned on corresponding to the switching operation of the fourth transistor M4.

Figure 2:
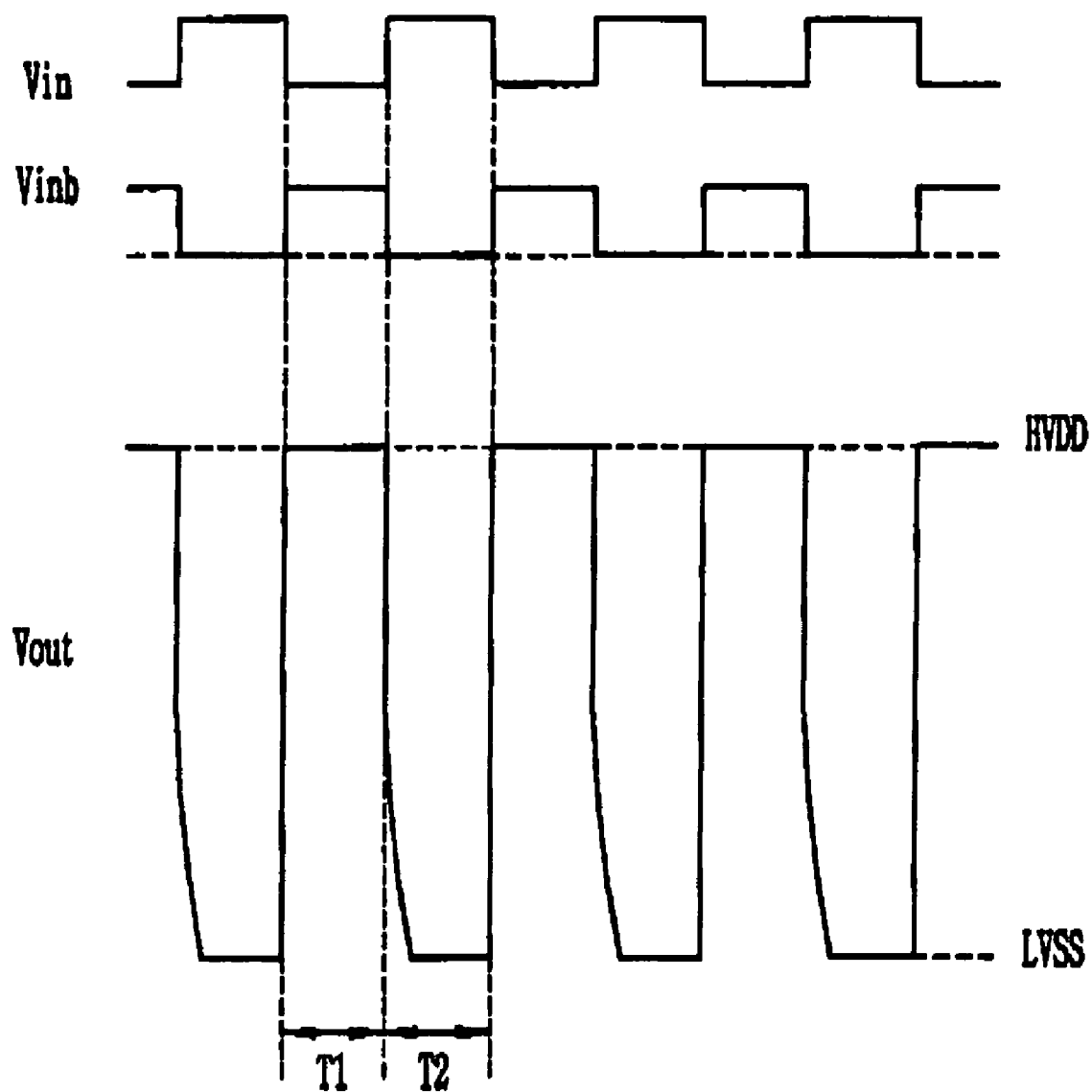
FIG. 2 is a waveform of input voltage and output voltage of the level shifter, according to the first embodiment of the present invention.

FIG. 2 is a waveform of input voltage and output voltage of the level shifter, according to the first embodiment of the present invention.

Referring to FIG. 2, operation of the level shifter according to the first embodiment of the present invention will be described hereinbelow.

For a period of T1, the first and third transistors M1, M3 are turned on by the first input signal Vin having a low level, and the fourth transistor M4 is turned off by the second input signal Vinb having a high level. Therefore, the first voltage is supplied to the output terminal Vout via the first transistor M1 and at the same time supplied to the first node N1 via the third transistor M3. For the period of T1, the output terminal Vout outputs the first voltage.

Further, for the period of T1, the second transistor M2 cuts off the second path between the output terminal Vout and the second power line LVSS. That is, the gate electrode of the second transistor M2 receives the first voltage from the first power line HVDD via the first and third transistors M1, M3 and the first node N1, and the source electrode receives the first voltage from the first power line HVDD via the first transistor M1 and the output terminal Vout. Therefore, for the period of T1, the voltage Vgs approaches zero (0), so that the second path between the second transistor M2 and the second power line LVSS is cut off, thereby reducing leakage current due to static current.

Thus, the level shifter according to the first embodiment of the present invention drives the voltage Vgs of the second transistor M2 to zero, while the output terminal Vout outputs the first voltage through the third transistor M3, thereby cutting off a static current path to reduce power consumption.

For a period of T2, the first and third transistors M1, M3 are turned off by the first input signal Vin having a high level, and the fourth transistor M4 is turned on by the second input signal Vinb having a low level.

As the fourth transistor M4 is turned on, the voltage applied to the first node N1 is lowered, so that a voltage higher than an absolute value of a threshold voltage |Vth| of the second transistor M2 is applied between the first and second electrodes of the capacitor C, i.e., between the source and gate electrodes of the second transistor M2. Thus, the second transistor M2 is turned on.

Then, when the voltage applied to the first node N1 is continuously lowered and thus the voltage applied between the source and gate electrodes of the fourth transistor M4 is lower than an absolute value of the threshold voltage of the fourth transistor M4, the fourth transistor M4 is turned off.

When the fourth transistor M4 is turned off, the second electrode of the capacitor C (N2) falls into a floating state, thereby maintaining the voltage across the capacitor C. Therefore, the voltage across capacitor C is maintained at a higher voltage than the absolute value of the threshold voltage |Vth| of the second transistor M2, so that the second transistor M2 is kept turned on, thereby lowering the output terminal voltage Vout to the second voltage.

Consequently, the level shifter according to the first embodiment of the present invention not only outputs a full-swing voltage alternating between a first voltage level and a second voltage level (refer to FIG. 2) but also, decreases the leakage current due to the static current of the PMOS transistor, thereby reducing the power consumption. Here, the full-swing voltage alternating between the first and second voltage levels is of a pulse ascending (or descending) from the first voltage level to the second voltage level and descending (or ascending) from the second voltage level to the first voltage level.

Further, the level shifter according to the first embodiment of the present invention can be configured as a driving circuit and a level shifting circuit (boosting circuit) using a PMOS transistor to output a fully low level voltage, and as a shift register and a level shifter included in a scan driving circuit of a flat panel display.

Figure 3:
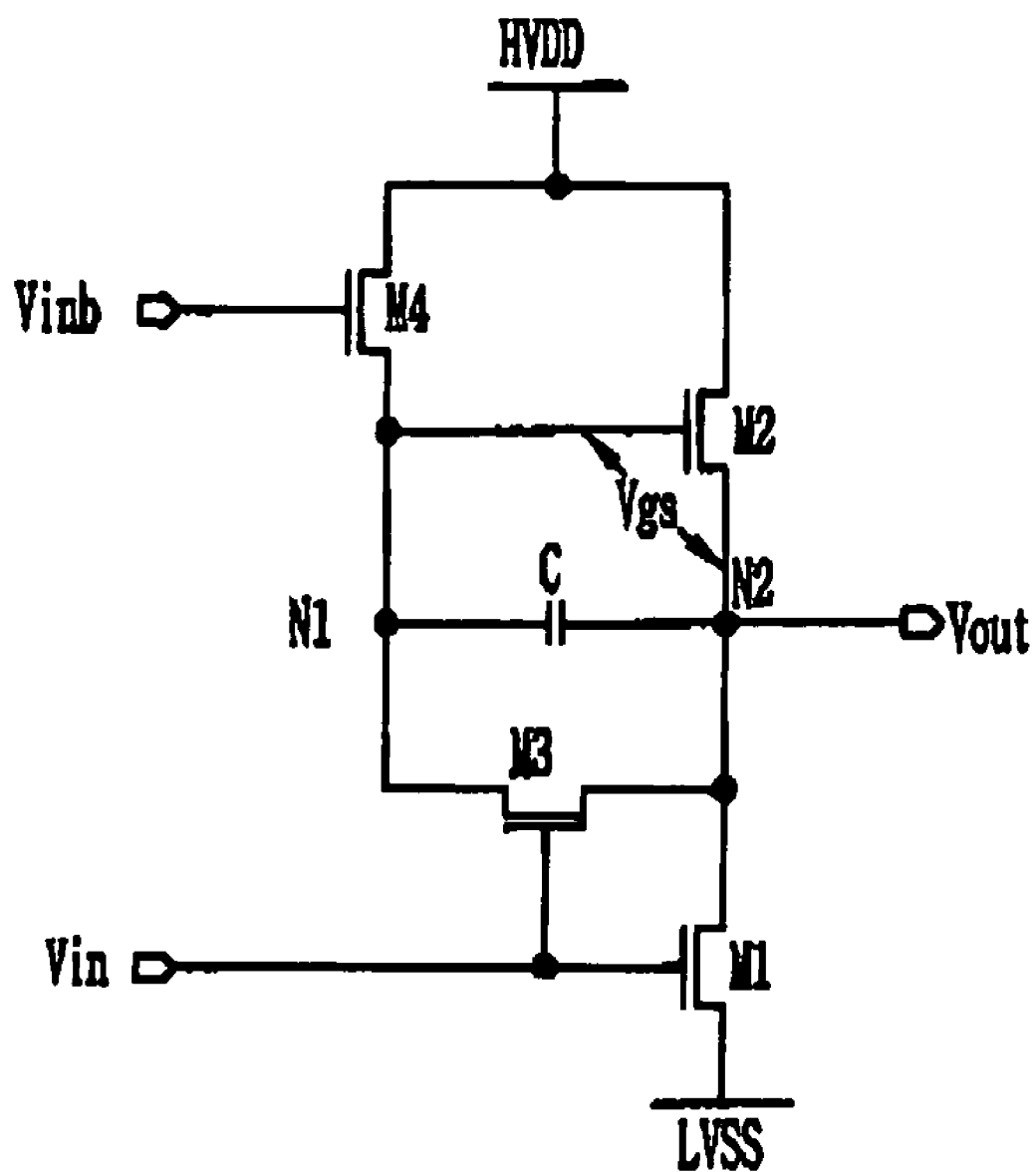
FIG. 3 is a circuit diagram of a level shifter comprising a NMOS transistor, according to a second embodiment of the present invention.
Figure 4:
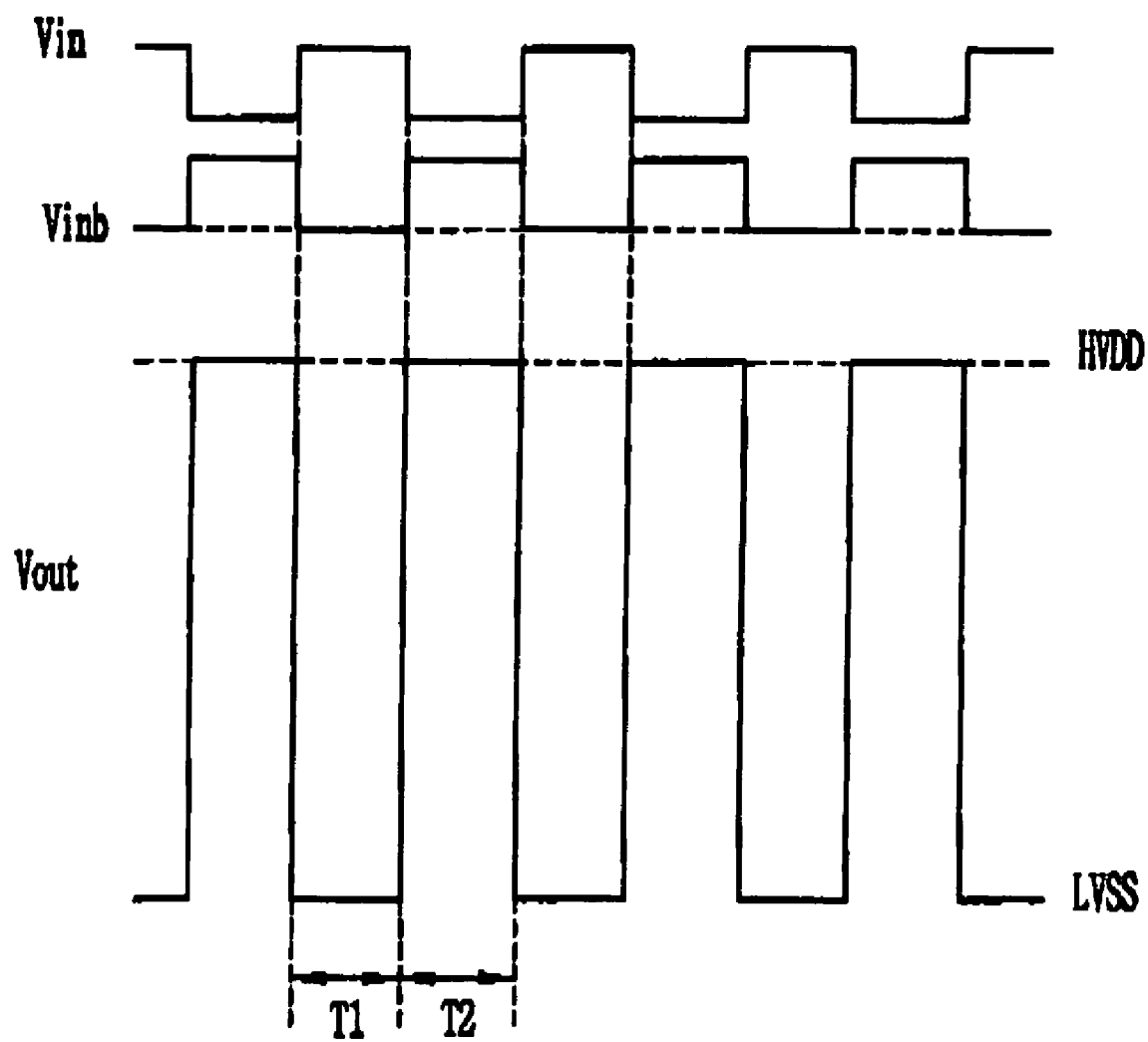
FIG. 4 is a waveform of input voltage and output voltage of the level shifter, according to the second embodiment of the present invention.

FIG. 3 is a circuit diagram of a level shifter comprising a NMOS transistor according to a second embodiment of the present invention, and FIG. 4 is a waveform of input voltage and output voltage of the level shifter according to the second embodiment of the present invention.

Referring to FIG. 3, a level shifter according to the second embodiment of the present invention has a similar configuration as that of the first embodiment except, transistors M1, M2, M3 and M4 used herein are n-metal oxide semiconductor (NMOS) transistors.

According to the second embodiment of the present invention, the level shifter comprising the NMOS transistors M1, M2, M3 and M4 is capable of outputting full-swing voltage alternating between a first voltage level and a second voltage level corresponding to a first and a second input voltage Vin and Vinb, respectively, as shown in FIG. 4.

Likewise, the level shifter according to the second embodiment of the present invention can be configured as a driving circuit and a level shifting circuit (boosting circuit) using a PMOS transistor to output a fully high level voltage, and as a shift register and a level shifter included in a scan driving circuit of a flat panel display.

Figure 5:
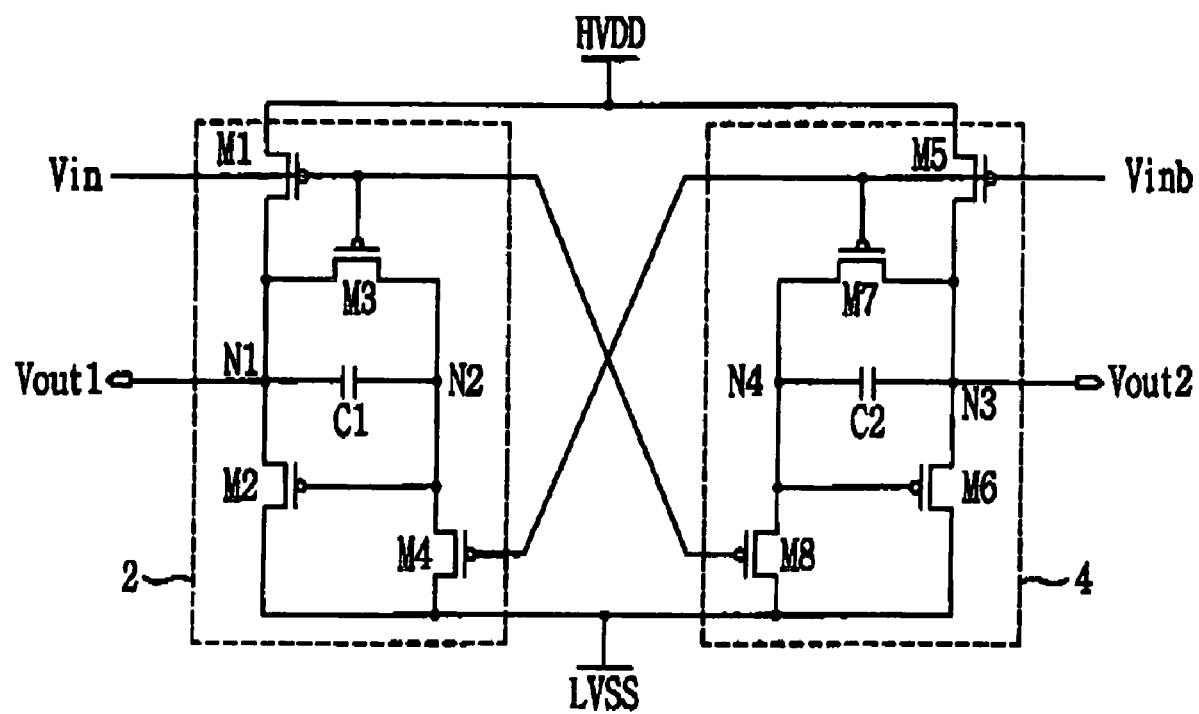
FIG. 5 is a circuit diagram of a level shifter comprising a PMOS transistor, according to a third embodiment of the present invention.

FIG. 5 is a circuit diagram of a level shifter comprising a PMOS transistor, according to a third embodiment of the present invention.

Referring to FIG. 5, a level shifter according to the third embodiment of the present invention comprises a first shifter 2 and a second shifter 4.

The first shifter 2 comprises first through fourth transistors M1 through M4, and a first capacitor C1. Here, the first through fourth transistors M1 through M4 are PMOS transistors.

The first transistor M1 is controlled by a first input signal Vin, and electrically connected between a first power line HVDD supplying a first voltage, and a first output terminal Vout1. Here, the first input signal Vin is of a pulse alternating between a first level voltage and a second level voltage lower than the first level voltage. At this time, the first transistor M1 comprises a source electrode connected to the first power line HVDD, and a drain electrode connected to the first output terminal Vout1. The first transistor M1 supplies the first voltage from the first power line HVDD to the first output terminal Vout1 in correspondence with the first input voltage Vin.

The second transistor M2 is controlled by voltage applied between a gate electrode and a source electrode thereof, and is electrically connected between the first output terminal Vout1 and a second power line LVSS supplying a second voltage different from the first voltage. Here, the second transistor M2 comprises the source electrode connected to the first output terminal Vout1, and a drain electrode connected to the second power line LVSS. The second transistor M2 supplies the second voltage from the second power line LVSS to the first output terminal Vout1 in correspondence with voltage applied to a second node N2, i.e., the gate electrode.

The third transistor M3 is controlled by the first input signal Vin, and electrically connected between the second node N2 connected to a first electrode of the capacitor C1 and the first output terminal Vout1. The third transistor M3 comprises a source electrode connected to the first output terminal Vout1, and a drain electrode connected to the second node N2. The third transistor M3 supplies the first voltage based on the first input signal Vin from the first transistor M2 to the second node N2. Thus, the third transistor M3 is turned on by the first input signal Vin having a low level, and allows the voltage Vgs applied between the gate and source electrodes of the second transistor M2 to approach zero (0), thereby cutting off static current between the second transistor M2 and the second power line LVSS.

The fourth transistor M4 is controlled by a second input signal Vinb, and electrically connected between the second node N2 and the second power line LVSS. Here, the second input signal Vinb is a complement of the first input signal Vin. The fourth transistor M4 comprises a source electrode connected to the second node N2, and a drain electrode connected to the second power line LVSS. The fourth transistor M4 supplies the second voltage based on the second input signal Vinb to the second node N2.

Capacitor C1 comprises a first electrode electrically connected to the second node N2 placed between the third transistor M3 and the fourth transistors M4, and a second electrode connected to the first output terminal Vout1. The capacitor C1 stores a voltage Vgs between the gate and source electrodes of the second transistor M2 depending on a switching operation of the fourth transistor M4, and then turns on/off the second transistor depending on the voltage Vgs between the gate and source electrodes of the second transistor M2. That is, the first capacitor C1 keeps the second transistor M2 turned on in correspondence to a switching operation of the fourth transistor M4.

The second shifter 4 comprises fifth through eighth transistors M5 through M8, and a second capacitor C2. Here, the fifth through eighth transistors M5 through M8 are PMOS transistors.

The fifth transistor M5 is controlled by a second input signal Vinb, and electrically connected between the first power line HVDD and a second output terminal Vout2. The fifth transistor M5 comprises a source electrode connected to the first power line HVDD, and a drain electrode connected to the second output terminal Vout2. The fifth transistor M5 supplies the first power from the first power line HVDD to the second output terminal Vout2 in correspondence with the second input signal Vinb.

The sixth transistor M6 is controlled by voltage applied between a gate electrode and a source electrode thereof, and is electrically connected between the second output terminal Vout2 and a second power line LVSS. Here, the sixth transistor M6 comprises a source electrode connected to the second output terminal Vout2, and a drain electrode connected to the second power line LVSS. The sixth transistor M6 supplies the second voltage from the second power line LVSS to the second output terminal Vout2 in correspondence with voltage applied to its gate electrode (N4).

The seventh transistor M7 is controlled by the second input signal Vinb, and electrically connected between the fourth node N4 connected to a first electrode of the second capacitor C2, and the second output terminal Vout2. The seventh transistor M7 comprises a source electrode connected to the second output terminal Vout2, and a drain electrode connected to the fourth node N4. The seventh transistor M7 supplies the first voltage based on the second input voltage Vinb from the fifth transistor M5 to the fourth node N2. Thus, the seventh transistor M7 is turned on by the second input signal Vinb having a low level, and allows the voltage Vgs applied between the gate and source electrodes of the sixth transistor M6 approach zero (0), thereby cutting off static current between the sixth transistor M6 and the second power line LVSS.

The eighth transistor M8 is controlled by the first input signal Vin, and electrically connected between the fourth node N4 and the second power line LVSS. The eighth transistor M8 comprises a source electrode connected to the fourth node N4, and a drain electrode connected to the second power line LVSS. The eighth transistor M8 supplies the second voltage based on the first input voltage Vin to the fourth node N4.

The second capacitor C2 comprises a first electrode electrically connected to the fourth node N4 placed between the seventh transistor M7 and the eighth transistors M8, and a second electrode connected to the second output terminal Vout2. The second capacitor C2 stores the voltage Vgs between the gate and source electrodes of the sixth transistor M6 depending on a switching operation of the sixth transistor M6, and turns on/off the sixth transistor M6, depending on the voltage Vgs between the gate and source electrodes of the sixth transistor M6. That is, the second capacitor C2 keeps the sixth transistor M6 turned on according to the switching operation of the eighth transistor M8.

Figure 6:
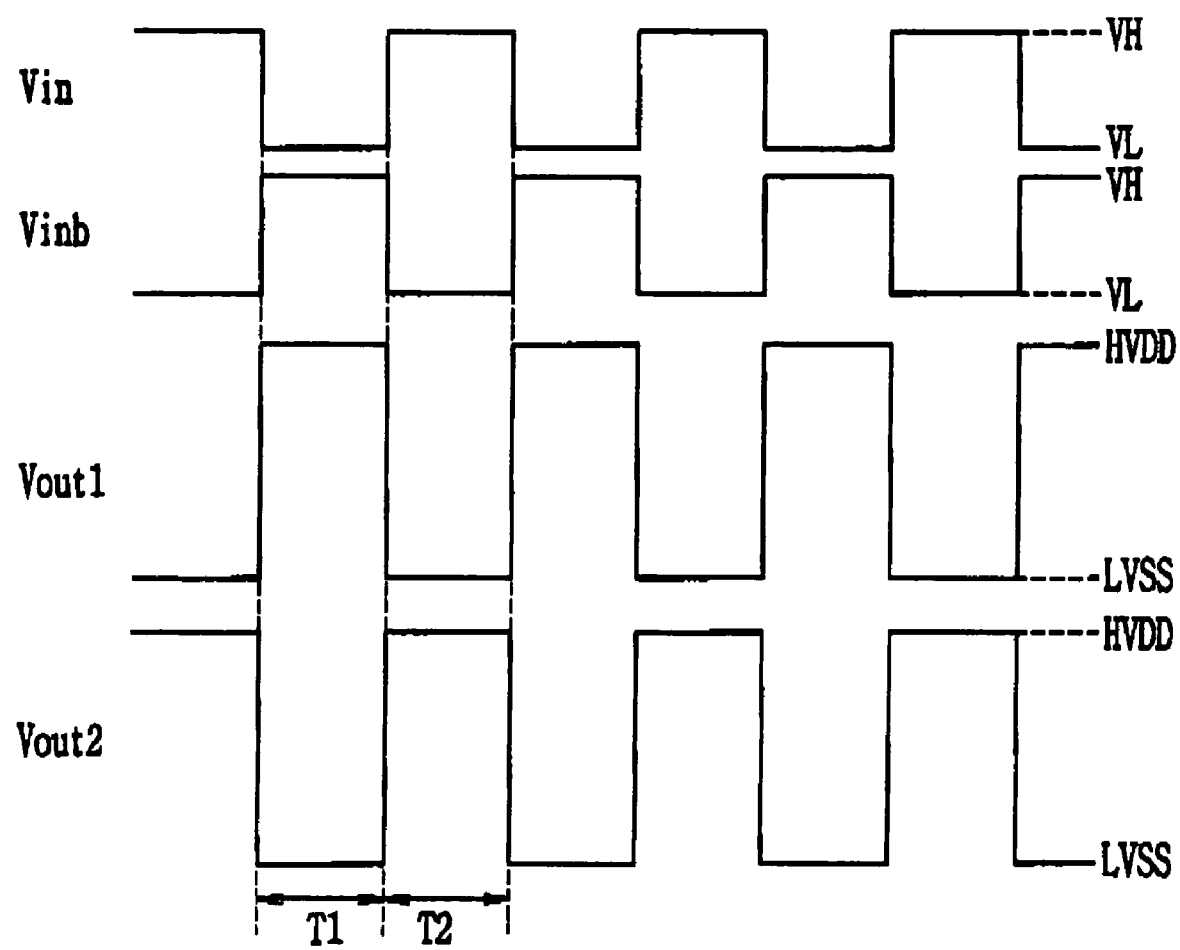
FIG. 6 is a waveform of input voltage and output voltage of the level shifter, according to the third embodiment of the present invention.

FIG. 6 is a waveform of input voltage and output voltage of the level shifter according to the third embodiment of the present invention. Referring to FIG. 6, operation of the level shifter according to the third embodiment of the present invention will be described hereinbelow.

For a period of T1, the first shifter 2 outputs the first voltage corresponding to the first and second input signals Vin and Vinb, and at the same time, the second shifter 4 outputs the second voltage. In the first shifter 2, for the period of T1, the first and third transistors M1, M3 are turned on by the first input signal Vin having a low level, and the fourth transistor M4 is turned off by the second input signal Vinb having a high level. Therefore, the first voltage is supplied from the first power line HVDD to the first output terminal Vout1 via the first transistor M1, and at the same time supplied to the second node N2 via the third transistor M3. For the period of T1, the first output terminal Vout1 outputs the first voltage.

Further, during the period of T1, the second transistor M2 cuts off a static current path between the first output terminal Vout1 and the second power line LVSS. That is, the gate electrode of the second transistor M2 receives the first voltage from the first power line HVDD via the first and third transistors M1, M3 and the second node N2, and the source electrode thereof receives the first voltage from the first power line HVDD via the first transistor M1 and the first output terminal Vout1. Therefore, for the period of T1, the voltage Vgs applied between the gate and source electrodes of the second transistor M2 is lowered to zero (0), so that the path between the first output terminal Vout1 and the second power line LVSS is cut off, thereby reducing the leakage current due to the static current.

Thus, the first shifter 2 of the level shifter according to the third embodiment of the present invention lowers the voltage Vgs applied between the gate and source electrodes of the second transistor M2 to zero, while the first output terminal Vout1 outputs the first voltage through the third transistor M3, thereby cutting off the static current path to reduce power consumption.

In the second shifter 4, for the period of T1, the fifth and seventh transistors M5, M7 are turned off by the second input signal Vinb having a high level, and the eighth transistor M8 is turned on by the first input signal Vin having a low level.

As the eighth transistor M8 is turned on, the voltage applied to the second output terminal Vout2 is lowered, so that a voltage higher than an absolute value of a threshold voltage |Vth| of the sixth transistor M6 is applied between the first and second electrodes of the second capacitor C2, i.e., between the source and gate electrodes of the sixth transistor M6. Thus, the sixth transistor M6 is turned on.

As the voltage applied to the second output terminal Vout2 is continuously lowered and thus the voltage applied between the source and gate electrodes of the eighth transistor M8 becomes lower than an absolute value of the threshold voltage of the eighth transistor M8, the eighth transistor M8 is turned off. When the eighth transistor M8 is turned off, the second electrode of the second capacitor C2 falls into a floating state, thereby keeping the voltage applied to the second capacitor C2. Therefore, the voltage applied between the first and second electrodes of the second capacitor C2 is kept higher than the absolute value |Vth| of the threshold voltage of the sixth transistor M6, so that the sixth transistor M6 is kept turned on, thereby lowering the voltage applied to the second output terminal Vout2 all the way down to the second voltage.

Thus, for the period of T1, the level shifter according to the third embodiment of the present invention cuts off the static current path between the first output terminal Vout1 and the second power line LVSS while outputting the first voltage through the third transistor M3, thereby reducing the leakage current. Further, the level shifter employs the second capacitor C2 for keeping the sixth transistor M6 turned on, thereby outputting the second voltage.

Consequently, the level shifter according to the third embodiment of the present invention not only outputs the full first voltage to the first output terminal Vout1 but also outputs a full second voltage to the second output terminal Vout2, so that the leakage current due to the static current of the PMOS transistor is decreased, thereby reducing the power consumption.

During a period of T2, the first shifter 2 of the level shifter outputs the second voltage corresponding to the first and second input signals Vin and Vinb, and at the same time the second shifter 4 outputs the first voltage. In the first shifter 2, for the period of T2, the first and third transistors M1, M3 are turned off by the first input signal Vin having a high level VH, and the fourth transistor M4 is turned on by the second input power Vinb having a low level VL.

As the fourth transistor M4 is turned on, the voltage applied to the first output terminal Vout1 is lowered, so that a voltage higher than an absolute value of a threshold voltage |Vth| of the second transistor M2 is applied between the first and second electrodes of the first capacitor C1, i.e., between the source and gate electrodes of the second transistor M2. Thus, the second transistor M2 is turned on.

Then, when the voltage applied to the first output terminal Vout1 is continuously lowered and thus the voltage applied between the source and gate electrodes of the fourth transistor M4 becomes lower than an absolute value of the threshold voltage of the fourth transistor M4, the fourth transistor M4 is turned off. When the fourth transistor M4 is turned off, the second electrode of the first capacitor C1 falls into a floating state, thereby keeping the voltage applied to the first capacitor C1. Therefore, the voltage applied between the first and second electrodes of the first capacitor C1 is kept higher than the absolute value of the threshold voltage |Vth| of the second transistor M2, so that the second transistor M2 is kept turned on, thereby lowering the voltage applied to the first output terminal Vout1 into the second voltage.

Similarly, in the second shifter 4, for the period of T2, the fifth and seventh transistors M5, M7 are turned on by the second input signal Vin having a low level VL, and the eighth transistor M8 is turned off by the second input power Vinb having a high level VH. Therefore, the first voltage is supplied from the first power line HVDD to the second output terminal Vout2 via the fifth transistor M5, and at the same time supplied to the fourth node N4 via the seventh transistor M7. For the period of T2, the second output terminal Vout2 outputs the first voltage.

Further, for the period of T2, the sixth transistor M6 cuts off a static current path between the second output terminal Vout2 and the second power line LVSS. That is, the gate electrode of the sixth transistor M6 receives the first voltage from the first power line HVDD via the fifth and seventh transistors M5, M7 and the fourth node N4, and the source electrode thereof receives the first voltage from the first power line HVDD via the fifth transistor M5 and the second output terminal Vout2. Therefore, in the period of T2, the voltage Vgs applied between the gate and source electrodes of the sixth transistor M6 becomes zero (0), so that the path of the sixth transistor M6 is cut off, thereby reducing the leakage current due to the static current.

Thus, the second shifter 4 of the level shifter according to the third embodiment of the present invention lowers the voltage Vgs applied between the gate and source electrodes of the sixth transistor M6 to zero, while the second output terminal Vout2 outputs the first voltage through the seventh transistor M7, thereby cutting off the static current path to reduce power consumption.

Thus, for the period of T2, the level shifter according to the third embodiment of the present invention cuts off the static current path of the sixth transistor M6 while outputting the first voltage through the seventh transistor M7, thereby reducing the leakage current. Further, the level shifter employs the first capacitor C1 for keeping the second transistor M2 turned on, thereby outputting the full second voltage. Consequently, the level shifter according to the third embodiment of the present invention not only outputs the full second voltage to the first output terminal Vout1 but also outputs the entire first voltage to the second output terminal Vout2, so that the leakage current due to the static current of the PMOS transistor is decreased, thereby reducing the power consumption.

As described above, the level shifter according to the third embodiment of the present invention employs two different input signals Vin and Vinb for outputting the first and second voltages HVDD and LVSS to the first and second output terminals Vout1 and Vout2. Further, the level shifter according to the third embodiment of the present invention employs the first and second capacitors C1 and C2 for outputting the entire (low level) second voltage LVSS, and cuts off the static current while the entire (high level) first voltage HVDD is outputted, thereby reducing power consumption of the circuit comprising the PMOS transistor.

Figure 7:
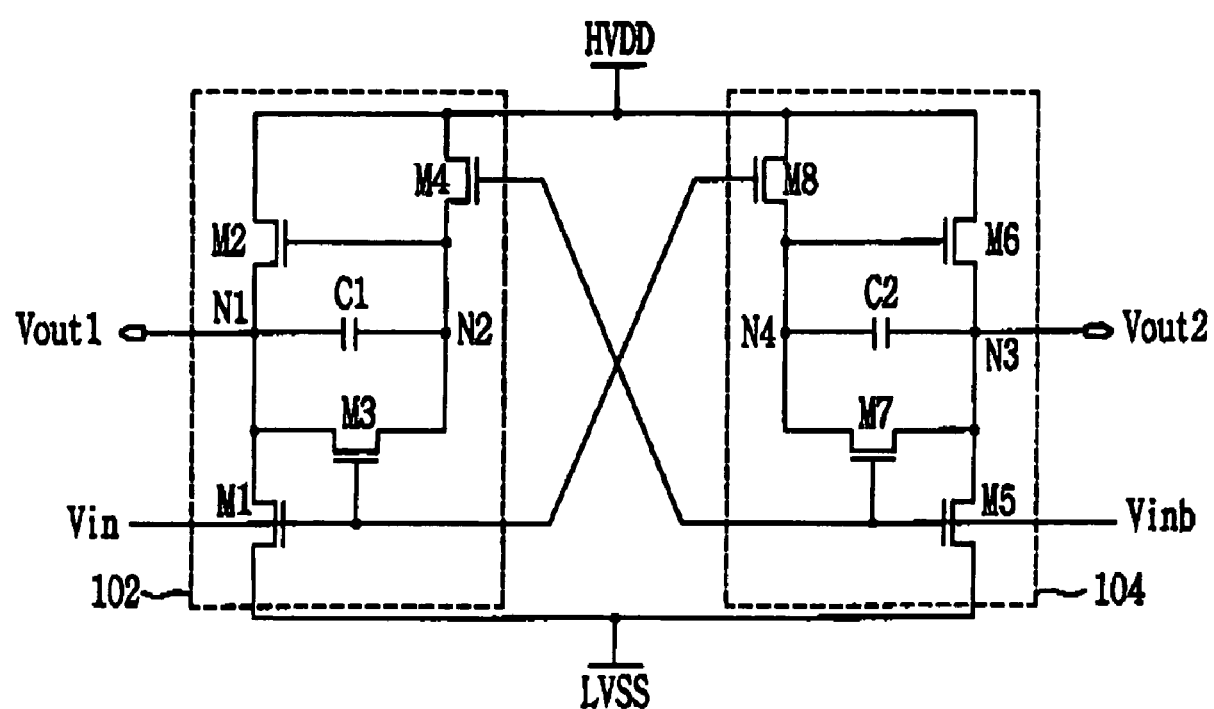
FIG. 7 is a circuit diagram of a level shifter comprising a NMOS transistor, according to a fourth embodiment of the present invention.
Figure 8:
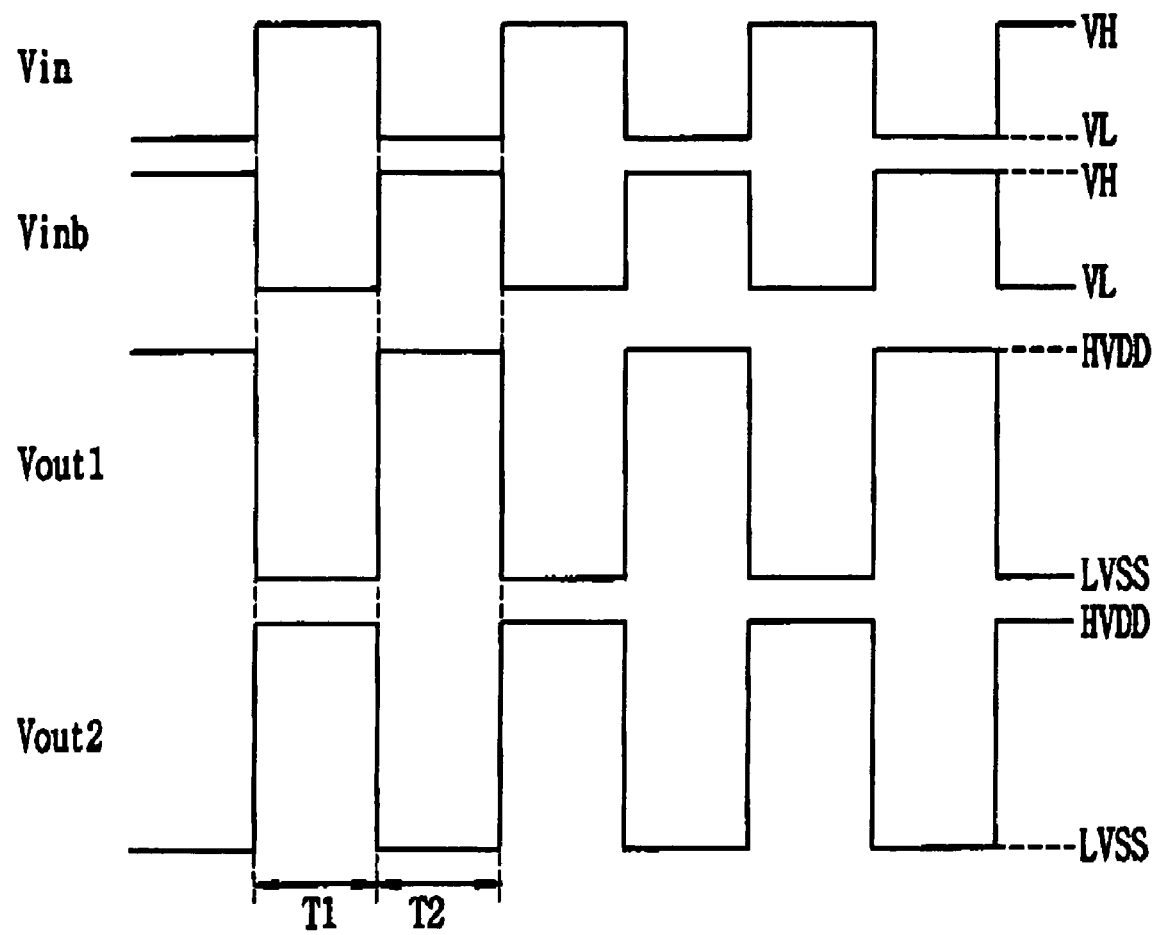
FIG. 8 is a waveform of input voltage and output voltage of the level shifter, according to the fourth embodiment of the present invention.

FIG. 7 is a circuit diagram of a level shifter comprising a NMOS transistor according to a fourth embodiment of the present invention, and FIG. 8 is a waveform of input voltage and output voltage of the level shifter according to the fourth embodiment of the present invention.

Referring to FIG. 7, a level shifter according to the fourth embodiment of the present invention has a similar configuration as that of the third embodiment except, transistors M1, M2, M3, M4, M5, M6, M7 and M8 used in first and second shifters 102 and 104 are of NMOS transistors.

According to the fourth embodiment of the present invention, each of the first and second shifters 102 and 104 comprising the NMOS transistors (M1, M2, M3, M4) and (M5, M6, M7, M8), respectively, uses two different input signal Vin and Vinb for outputting first and second voltages HVDD and LVSS to first and second output terminals Vout1 and Vout2 at the same time, as shown in FIG. 8. Further, the level shifter according to the fourth embodiment of the present invention employs the first and second capacitors C1 and C2 for outputting the full (high level) first voltage HVDD, and cuts off the static current while the full (low level) second voltage LVSS is outputted, thereby reducing power consumption of the circuit comprising the NMOS transistor.

Figure 9:
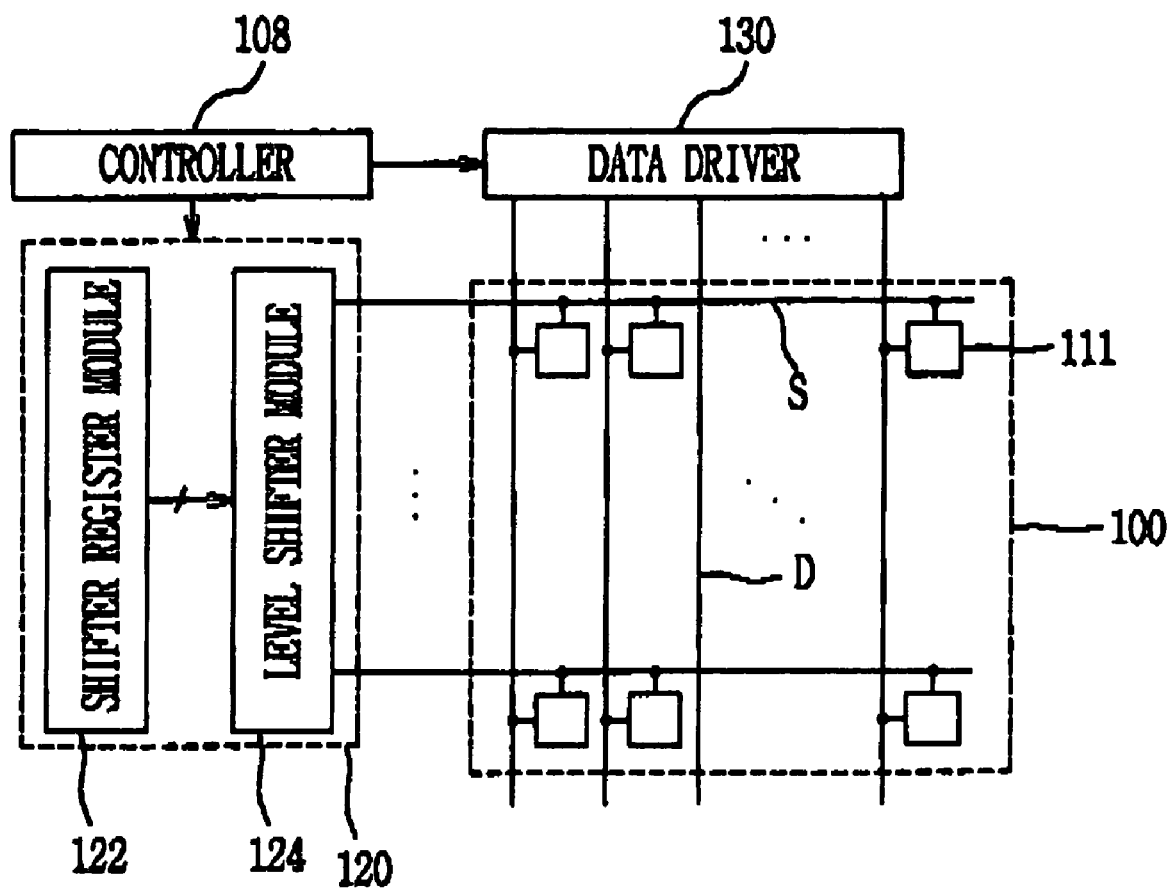
FIG. 9 is a block diagram of a flat panel display comprising one of the level shifters of the first through fourth embodiments of the present invention.

FIG. 9 is a block diagram of a flat panel display comprising one of the level shifters according to the first through fourth embodiments of the present invention.

Here, the level shifter according to the first through fourth embodiment of the present invention can be configured as a driving circuit and a level shifting circuit (boosting circuit) using a PMOS transistor to output a full low level voltage, and as a shift register and a level shifter included in a scan driving circuit of a flat panel display.

For example, as shown in FIG. 9, a flat panel display comprising the level shifter according to one of the first through fourth embodiments of the present invention comprises an image display module 100 having pixels 111 formed where a scan line S and a data line D are crossed; a scan driver 120 to drive the scan lines S; a data driver 130 to drive the data lines D; and a controller 108 to control the scan driver 120 and the data driver 130 and supply a data signal to the data driver 130.

The respective pixels 111 are selected when a selection signal is transmitted to the scan line S. The selected pixels then display a picture corresponding to the data signal supplied to the data line D. Here, the pixel 111 can be realized by a liquid cell of a liquid crystal display (LCD), a discharging cell of a field emission display (FED) or a plasma display panel (PDP), an emission cell of the light emitting display, etc. Particularly, each pixel 111 can be applied to a large-sized flat panel display comprising a light emitting display employing the PMOS transistor for driving the pixel.

The controller 108 transmits a scan control signal to the scan driver 120 to drive timing of the scan driver 120, transmits a data control signal to the data driver 130 to drive timing of the data driver 130, and transmits an external data signal to the data driver 130.

The data driver 130 supplies the data signal from the controller 108 to the pixel 111 through the data lines D in response to the data control signal supplied from the controller 108. The data signal corresponding to one horizontal line is supplied from the data driver 130 to the data lines D for every one horizontal period.

The scan driver 120 generates the selection signal for enabling the scan lines S in response to the scan control signal such as a start pulse and a clock signal transmitted from the controller 108, and supplies the selection signals to the scan lines S in sequence.

Here, the scan driver 120 comprises a shift register module 122 for shifting the start pulse transmitted from the controller 108 in sequence, and a level shifter module 124 for shifting a level of an input signal received from the shift register module 122 and supplying the level-shifted input signal to the scan lines S.

The shift register module 122 comprises a plurality of shift registers to shift the start pulse in sequence, and transmits it to the level shifter module 124.

The level shifter module 124 comprises a plurality of level shifters according to the foregoing embodiments of the present invention. Such a level shifter shifts a voltage range of the input signal received from the shift register and then transmits it to the scan lines.

Figure 10:
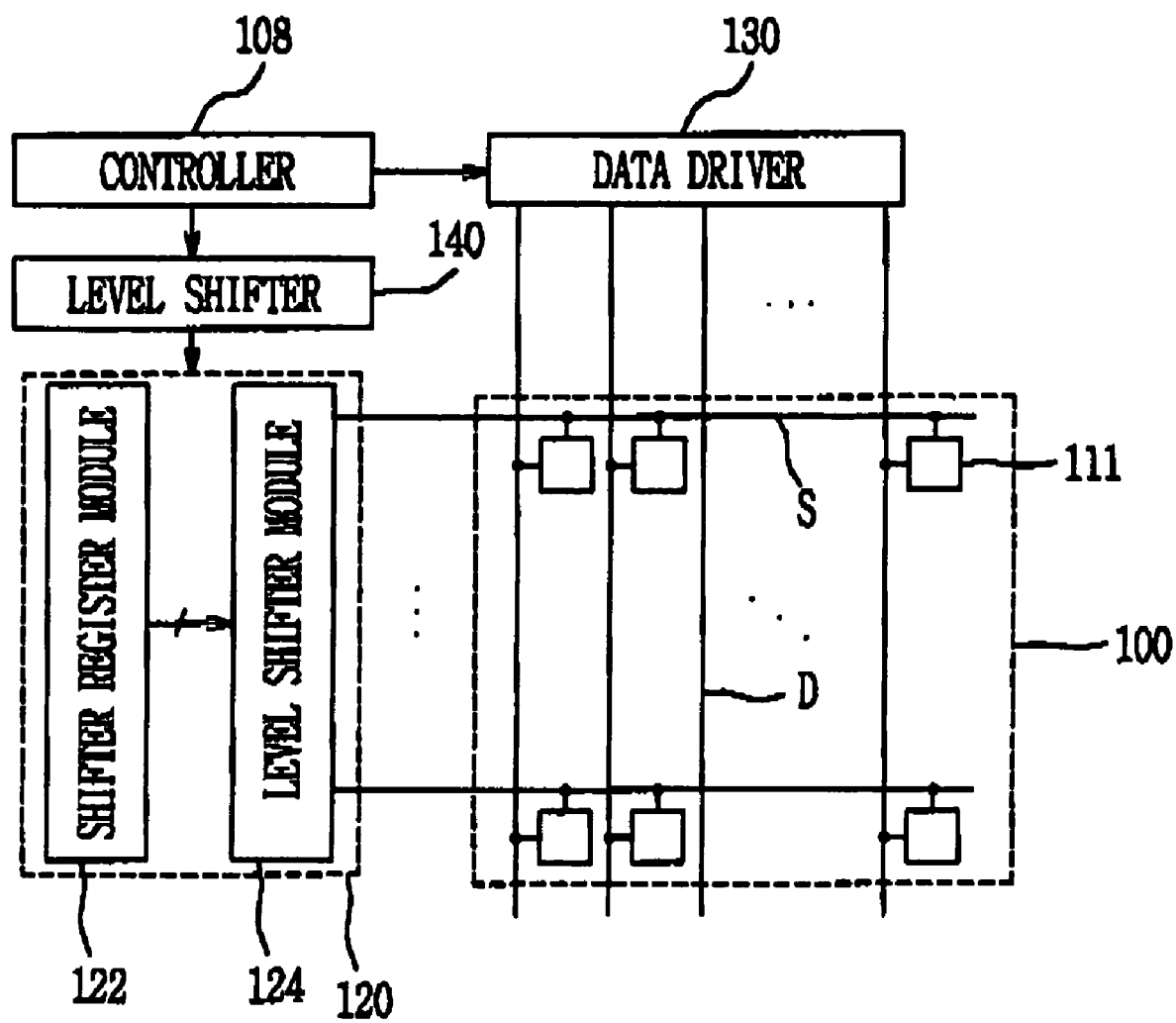
FIG. 10 is a block diagram of another flat panel display comprising one of the level shifters of the first through fourth embodiments of the present invention.

FIG. 10 is a block diagram of another flat panel display comprising one of the level shifter according to the first through fourth embodiments of the present invention.

Referring to FIG. 10, a flat panel display further comprises a level shifter 140 according to the foregoing embodiments of the present invention between the controller 108 and the scan driver 120. This way, the voltage range of the start pulse outputted from the controller 108 can be shifted into a voltage range needed for the shift register module 122.

As described above, the present invention provides a level shifter and a flat panel display comprising the same, in which a static current path of a second transistor placed between an output terminal and a second power line is cut off by a third transistor to reduce power consumption, and the second transistor is kept turned on by a capacitor to output a full voltage swing to an output terminal.

Further, the present invention provides a level shifter and a flat panel display comprising the same, in which first and second voltages are outputted to first and second output terminals at the same time by two different input signals. Such a level shifter outputs a full (low level) second voltage using a capacitor and cuts off a static current, while a full (high level) first voltage is outputted, thereby reducing power consumption of a PMOS/NMOS transistor circuit.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A level shifter comprising:
a first transistor electrically coupled between an output terminal and a first voltage source supplying a first voltage for applying the first voltage to the output terminal in correspondence with a first input signal applied to a gate electrode of the first transistor;
a second transistor electrically coupled between the output terminal and a second voltage source supplying a second voltage for applying the second voltage to the output terminal in correspondence with a voltage applied between gate and source electrodes thereof;
a third transistor electrically coupled between the gate and source electrodes of the second transistor for lowering the voltage applied between the gate and source electrodes of the second transistor to zero in correspondence with the first input signal applied to a gate electrode of the third transistor;
a fourth transistor electrically coupled between the gate electrode of the second transistor and the second voltage supply for turning on the second transistor in correspondence with a second input signal applied to a gate electrode of the fourth transistor; and
a capacitor electrically coupled between the gate and source electrodes of the second transistor to keep the voltage applied between the gate and source electrodes of the second transistor to turn on the second transistor when the fourth transistor is turned off in correspondence with the second input signal.

2. The level shifter according to claim 1, wherein the second input signal and the first input signal are complementary to each other.

3. The level shifter according to claim 1, wherein the first through fourth transistors are PMOS transistors.

4. The level shifter according to claim 1, wherein the first through fourth transistors are NMOS transistors.

5. The level shifter according to claim 2, wherein the capacitor stores the voltage applied between the gate and source electrodes of the second transistor when the fourth transistor is turned on, and keeps the second transistor turned on to lower the voltage applied to the output terminal to the same level as the second voltage.

6. A level shifter comprises:
a first transistor connected between a first power line and an output terminal and controlled by a first input signal applied to its gate electrode;
a second transistor connected between a second power line and the output terminal and controlled by a signal applied to a first node connected to its gate electrode;
a capacitor having a first electrode connected to the output terminal and a second electrode connected to the first node;
a third transistor connected between the output terminal and the first node and controlled by the first input signal applied to its gate electrode; and
a fourth transistor connected between the first node and the second power line, and controlled by a second input signal applied to its gate electrode.

7. The level shifter according to claim 6, wherein the first through fourth transistors are at least one of the group consisting of PMOS transistors and NMOS transistors.

8. The level shifter according to claim 6, wherein the second input signal and the first input signal are complementary of each other.

9. A level shifter comprising:
a first voltage path for supplying a first voltage to an output terminal responsive to a first input signal;
a second voltage path for supplying a second voltage to the output terminal responsive to a second input signal;
a switch to cut off the second path from the output terminal responsive to the first input signal; and
a capacitor to re-establish the second path for supplying the second voltage to the output terminal responsive to the second input signal.

10. The level shifter according to claim 9, wherein the second input signal and the first input signal are complementary of each other.

11. The level shifter according to claim 9, wherein the second voltage is lower than the first voltage.

12. The level shifter according to claim 9, wherein the first path is connected between a first power line supplying the first voltage and the output terminal, and the first path includes a first transistor operating in correspondence with the first input signal.

13. The level shifter according to claim 12, wherein the second path is connected between a second power line supplying the second voltage and the output terminal, and the second path includes a second transistor operating in correspondence with voltage applied to opposite terminals of the capacitor.

14. The level shifter according to claim 13, further comprising a fourth transistor connected between a first node connected to a gate electrode of the second transistor and the second power line, wherein the fourth transistor turns on the second transistor in correspondence with the second input signal.

15. The level shifter according to claim 14, wherein the switch, first, second and fourth transistors are one of the group consisting of PMOS transistors and NMOS transistors.

16. The level shifter according to claim 14, wherein the capacitor comprises
a first electrode connected to the output terminal; and
a second electrode connected to the first node.

17. The level shifter according to claim 14, wherein switch is a transistor which supplies the first voltage to the first node via the first transistor in correspondence with the first input signal.

18. The level shifter according to claim 17, wherein the second transistor forms the second path in correspondence with the voltage applied to the first node.

19. The level shifter according to claim 14, wherein the capacitor stores the voltage applied between the gate and source electrodes of the second transistor when the fourth transistor is turned on, and keeps the second transistor turned on to drive the voltage applied to the output terminal to the same level as the second voltage.

20. A level shifter comprising:
a first shifter comprising a first transistor to apply a first voltage to a first output terminal in correspondence with a first input signal, a second transistor to apply a second voltage to the first output terminal in correspondence with voltage applied between gate and source electrodes thereof, a third transistor to lower the voltage applied between the gate and source electrodes of the second transistor to zero in correspondence with the first input signal, and a first capacitor to maintain the voltage applied between the gate and source electrodes of the second transistor to turn on the second transistor in correspondence with a second input signal; and a second shifter to output a voltage, which is a complement of the voltage outputted from the first output terminal, to a second output terminal in correspondence with the first and second input signals.

21. The level shifter according to claim 20, further comprising a fourth transistor to turn on the second transistor in correspondence with the second input signal.

22. The level shifter according to claim 21, wherein the second shifter further comprises:

a fifth transistor to apply the first voltage to the second output terminal in correspondence with the second input signal;

a sixth transistor to apply the second voltage to the second output terminal in correspondence with voltage applied between gate and source electrodes thereof;

a seventh transistor to lower the voltage applied between the gate and source electrodes of the sixth transistor to zero in correspondence with the second input signal; and a second capacitor to maintain the voltage applied between the gate and source electrodes of the sixth transistor to turn on the sixth transistor in correspondence with the first input signal.

23. The level shifter according to claim 22, wherein the second shifter further comprises an eighth transistor to turn on the sixth transistor in correspondence with the first input signal.

24. The level shifter according to claim 23, wherein the first through eighth transistors are one or more of a group consisting of PMOS transistors and NMOS transistors.

25. The level shifter according to claim 20, wherein the second input signal and the first input signal are complementary of each other.

26. The level shifter according to claim 21, wherein the first capacitor stores the voltage applied between the gate and source electrodes of the second transistor when the fourth transistor is turned on, and keeps the second transistor turned on to drive the voltage applied to the first output terminal to the same level as the second voltage.

27. The level shifter according to claim 23, wherein the second capacitor stores the voltage applied between the gate and source electrodes of the sixth transistor when the eighth transistor is turned on, and keeps the sixth transistor turned on to drive the voltage applied to the second output terminal to the same level as the second voltage.

28. A level shifter comprising:

a first transistor controlled by a first input signal and connected between a first power line and a first output terminal;

a second transistor connected between the first output terminal and a second power line different from the first power line;

a third transistor controlled by the first input signal and connected between the first output terminal and a gate electrode of the second transistor;

a fourth transistor controlled by a second input signal, and connected between the gate electrode of the second transistor and the second power line;

a first capacitor connected between the first output terminal and a gate electrode of the second transistor;

a fifth transistor controlled by the second input signal and connected between the first power line and a second output terminal;

a sixth transistor connected between the second output terminal and the second power line;

a seventh transistor controlled by the second input signal and connected between the second output terminal and a gate electrode of the sixth transistor;

an eighth transistor controlled by the first input signal and connected between the gate electrode of the six transistor and the second power line; and a second capacitor connected between the second output terminal and the gate electrode of the sixth transistor.

29. The level shifter according to claim 28, wherein the first through eighth transistors are one or more of a group consisting of PMOS transistors and NMOS transistors.

30. The level shifter according to claim 28, wherein the first input signal and the second input signal are complementary of each other.

* * * * *

UNITED STATES PATENT AND TRADEMARK OFFICE
CERTIFICATE OF CORRECTION

PATENT NO. : 7,304,502 B2  Page 1 of 1
APPLICATION NO. : 11/170782
DATED : December 4, 2007
INVENTOR(S) : Bo Young Chung It is certified that error appears in the above-identified patent and that said Letters Patent is hereby corrected as shown below:

Column 14, line 41,  After "comprises",
Claim 16  Insert --:--

Column 16, line 29,  Delete "six",
Claim 28  Insert --sixth--

Signed and Sealed this

Second Day of September, 2008

JON W. DUDAS
*Director of the United States Patent and Trademark Office*